(12) United States Patent
Sargent et al.

(10) Patent No.: US 8,310,022 B2
(45) Date of Patent: Nov. 13, 2012

(54) PHOTOCONDUCTIVE MATERIALS AND DEVICES WITH INTERNAL PHOTOCONDUCTIVE GAIN

(76) Inventors: Edward H. Sargent, Toronto (CA); Vlad Sukhovatkin, Mississauga (CA)

( * ) Notice: Subject to any disclaimer, the term of this patent is extended or adjusted under 35 U.S.C. 154(b) by 304 days.

(21) Appl. No.: 12/793,010

(22) Filed: Jun. 3, 2010

(65) Prior Publication Data

US 2010/0309460 A1      Dec. 9, 2010

Related U.S. Application Data

(60) Provisional application No. 61/213,378, filed on Jun. 3, 2009.

(51) Int. Cl.
*H01L 31/08*      (2006.01)
(52) U.S. Cl. ............ 257/443; 257/21; 977/774; 438/63
(58) Field of Classification Search .................... 257/21, 257/443, E31.033; 977/773–774; 438/63, 438/57
See application file for complete search history.

(56) References Cited

U.S. PATENT DOCUMENTS

| 7,482,195 | B2 * | 1/2009 | Salzman et al. | 438/57 |
| 2010/0326506 | A1 * | 12/2010 | Lifshitz et al. | 136/255 |
| 2012/0003773 | A1 * | 1/2012 | Harkness et al. | 438/63 |

* cited by examiner

*Primary Examiner* — Hoa Pham
(74) *Attorney, Agent, or Firm* — Bacon & Thomas, PLLC

(57) ABSTRACT

The invention provides a new class of photoconductive materials and devices, and methods for obtaining high internal photoconductive gain. The devices include a semiconductor or material with an electronic band gap provided in a confined geometry and which exhibits multi-exciton generation (MEG) when illuminated with photons with energies above the threshold for MEG. Due to carrier-carrier Coulombic interactions, multi-excitons within the confined material efficiently recombine via Auger recombination, in which a carrier from one exciton is excited to a higher energy level relative to the band edge. Carriers excited by Auger recombination are subsequently trapped by trap states that capture carriers excited high above the band edge more efficiently than carriers near the band edge. Carriers trapped by the trap states allow for the collection and recirculation of untrapped carriers of opposite charge when used as a photoconductive device, producing high internal photoconductive gain.

17 Claims, 12 Drawing Sheets a  b

PHOTOCONDUCTIVE MATERIALS AND DEVICES WITH INTERNAL PHOTOCONDUCTIVE GAIN

CROSS-REFERENCE TO RELATED APPLICATION

This application claims priority to U.S. Provisional Application No. 61/213,378 titled "PHOTOCONDUCTIVE MATERIALS AND DEVICES WITH INTERNAL PHOTOCONDUCTIVE GAIN" and filed on Jun. 3, 2009, the entire contents of which are incorporated herein by reference.

FIELD OF THE INVENTION

The present invention relates to photoconductive devices and optical imaging devices. More particularly, the present invention relates to confined structures for use as photoconductive detectors and photoconductive arrays with high internal photoconductive gain. The invention further relates to photoconductive imagers capable of detecting light at wavelengths well above the band gap of the material from which they are constituted. For example, the invention relates to building ultraviolet imagers using materials having a near-infrared band gap (with energy <1.8 eV); and, in another embodiment, to building visible-wavelength imagers using materials having a band gap in the short-wavelength infrared (with energy <1 eV).

BACKGROUND OF THE INVENTION

Optical sensors are widely used in applications ranging from power measurement to imaging. While the requirements for optical sensors vary significantly depending on the requirements of the application, a light sensor suited for imaging must simultaneously provide high responsivity combined with rapid temporal response (typically less than $\frac{1}{15}$ of a second).

Digital imaging chips based on silicon photodiodes are the mainstay of current imaging products. Such devices are typically limited to at most one photoelectron per photon and thereby necessitate the use of an extremely low-noise readout scheme. Furthermore, many digital imaging devices suffer from poor detectivity in the ultraviolet spectrum, particularly in the UV-B and UV-C spectral ranges.

Recently, a new class of solution-processed materials has been shown to be a promising platform technology for photodetectors. However, reports of ultraviolet sensing elements based on solution-processed materials have, however, provided either promising sensitivity (61 A/W) but hundreds-of-seconds temporal response (28); or else fast response but few-mA/W UV responsivity (29).

One potential avenue for improving the performance of photoconductive devices, particular for photon energies lying well above the semiconductor's bandgap, involves the excitation and decay dynamics of multiple carriers. One such effect is multi-exciton generation (MEG), which involves the creation of two or more electron-hole pairs in a semiconductor per absorbed photon (1).

MEG has been recently reported in a wide range of semiconductor materials and structures. Colloidal quantum dot materials in which MEG has been reported experimentally include PbS and PbSe (2), PbTe (3), CdSe (4), and Si (5). In bulk semiconductors, carrier multiplication has been observed repeatedly over the past five decades, both in elemental semiconductors such as germanium (6) and silicon (7), and also in lead chalcogenides (8) including the infrared-bandgap bulk semiconductor PbS (9). Very recently, experiments that carefully account for processes such as photoionization of nanoparticles during spectroscopic studies have evidenced the production of more than one exciton per photon (10) in colloidal quantum dots, with yields ranging from 1.1 to 2.4 excitons per photon (10) when the photon energy exceeds the MEG threshold near $\sim E_{photon}/E_{bandgap} > 2.7$ (11) where $E_{photon}$ is the photon energy and $E_{bandgap}$ the quantum-confined bandgap.

MEG has been reported, based on all-optical spectroscopic data, not only in solution but also in thin solid films; however, in spite of numerous attempts using materials systems and photon energies reported to manifest MEG, neither the external nor the internal quantum efficiency of the photocurrent in a device has been shown to exceed 100% (12-20). In particular, one careful and systematic study (21) recently aimed to explore whether a key signature of MEG—an internal quantum efficiency of greater than unity—was observable in the photocurrent of a low-bandgap PbSe colloidal quantum dot photovoltaic device. Once reflection and absorption were carefully taken into account, IQEs approaching, but not exceeding, 100% were reported.

As a result of these findings, the utility of MEG in optical devices, particular photovoltaic devices, is now regarded as being uncertain. What is therefore needed are devices that utilize MEG to achieve improved photodetector performance.

SUMMARY OF THE INVENTION

The present invention addresses this need by providing a device comprising a semiconductor or material with an electronic band gap provided in a confined geometry and capable of exhibiting multi-exciton generation (MEG) when illuminated with photons with energies above the threshold for MEG. Due to carrier-carrier Coulombic interactions, multi-excitons within the confined material efficiently recombine via Auger recombination, in which a carrier from one exciton is excited to a higher energy level relative to the band edge. Carriers excited by Auger recombination are subsequently trapped by trap states that capture carriers excited high above the band edge more efficiently than carriers near the band edge. Carriers trapped by the trap states allow for the collection and recirculation of untrapped carriers of opposite charge when used as a photoconductive device, producing high internal photoconductive gain.

Accordingly, in a first aspect, there is provided a photoconductive device comprising: a material provided in a confined geometry, the material comprising an electronic band gap, trap states located near a confinement-induced band edge, and an energy barrier, wherein carrier capture by the trap states is more efficient for carriers excited high above the band edge relative to carriers near the band edge; and electrical contacts connected to the material; wherein the confined geometry is selected to achieve spatial overlap of photogenerated multiple excitons; and wherein the energy barrier is further selected to allow carriers excited by Auger recombination of the multiple excitons to be captured by the trap states.

The material preferably comprises a semiconductor, and more preferably comprises particles. The particles may be selected from the group consisting of quantum dots, quantum boxes, nanoparticles and nanocrystals. The particles may be functionalized to support the electronic transport of photocurrent between the particles.

Quantum confinement effects preferably produce a separation of energy levels relative to energy levels in bulk material. A decay of the excited carriers via phonons is preferably suppressed relative to decay to the trap states.

The trap states may be selected from the group consisting of defect states localized at an interface, trap states formed by the attachment of ligands to the surface of a particle or other structure, impurities, native sulfates and native oxides, and the material may be selected from the group consisting of CdSe, CdS, CdSe, Si, ZnS, ZnSe, ZnTe, ZnO, PbO, PbS, PbSe, PbSSe, PbTe, InAs, InSb, Ge.

The material may comprise a core-shell heterostructure, wherein the shell forms the energy barrier. The core may comprise a material selected from the group consisting of CdSe, CdS, CdSe, Si, ZnS, ZnSe, ZnTe, ZnO, PbO, PbS, PbSe, PbSSe, PbTe, InAs, InSb, Ge, and the shell may comprise one of a material selected from the group and a material selected from the group consisting of higher-bandgap semiconductors comprising Cd{S, Se, Te, O}, Zn{S, Se, Te, O}, Sn{S, Se, Te, O}, and PbO.

The material may be provided in a substantially planar structure and the electrical contacts may comprise planar electrodes each contacting one side of the planar structure, wherein one or both of the planar electrodes are transmissive over a selected spectral range.

Photoconductive devices according to the above embodiments may be formed into an array that is preferably an imaging array. The material is preferably selected to have threshold photon energy for multi-exciton generation in the ultraviolet range of the electromagnetic spectrum, and wherein the imaging array preferably exhibits a high internal gain in the ultraviolet range of the electromagnetic spectrum.

In another aspect, there is provided a method of detecting optical power with a photoconductive device, the photoconductive device comprising a material provided in a confined geometry, the material comprising an electronic band gap, and trap states near a confinement-induced conduction band edge of the band gap, and further comprising an energy barrier wherein carrier capture by the trap states is more efficient for carriers excited high above the band edge relative to carriers near the band edge, the method comprising the steps of: illuminating the photoconductive device with photons having an energy greater than approximately 2.7 times a confinement-induced band gap of the material, and wherein carriers excited by Auger recombination of multiple excitons decay to the one or more trap states; applying a voltage to the photoconductive device and measuring an electrical signal related to a photocurrent; and relating the electrical signal to an optical power incident on the photoconductive device.

In yet another aspect, there is provided a photoconductive device comprising a first electrical contact; an optically sensitive layer having a band gap; and a second electrical contact; wherein a photocurrent per absorbed photon following illumination of the optically sensitive layer by photons having energy of greater than or equal to 3 times the band gap is at least twice a photocurrent per absorbed photon following illumination of the optically sensitive layer by photons having energy in the range 1-2 times the band gap.

A further understanding of the functional and advantageous aspects of the invention can be realized by reference to the following detailed description and drawings.

BRIEF DESCRIPTION OF THE DRAWINGS

The embodiments of the present invention are described with reference to the attached figures, wherein.

DETAILED DESCRIPTION OF THE INVENTION

Figure 1:
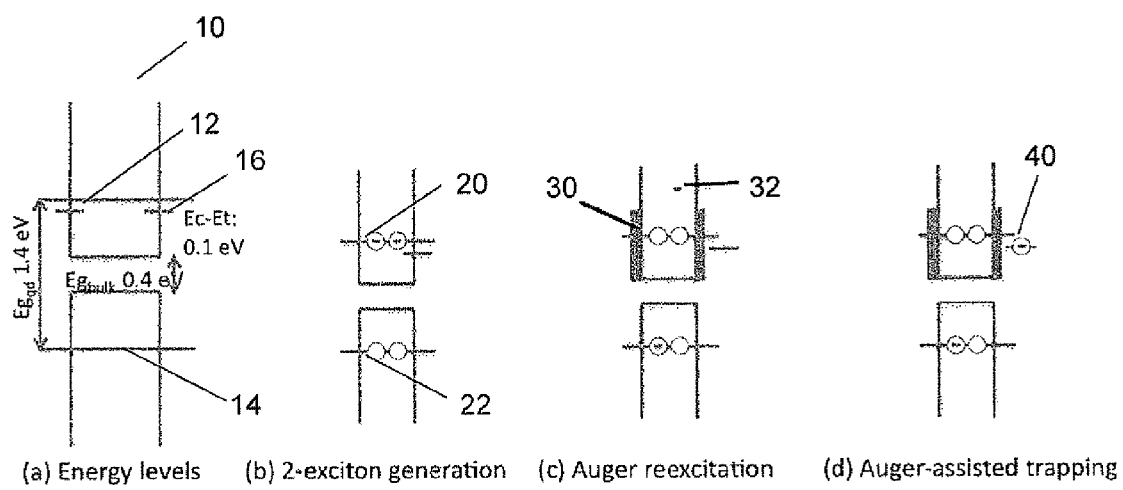
FIG. 1 illustrates the process of multi-exciton generation accompanied by photoionization; (a) bands and trap levels for the quantum dots; (b) generation of a pair of excitons via photon absorption followed by carrier multiplication; (c) Auger-induced excitation of an electron to a higher-lying level concomitant with recombination of the other exciton; (d) Efficient trapping of the excited electron.

Generally speaking, the systems described herein are directed to a photoconductive device employing MEG and Auger-assisted photoionization. As required, embodiments of the present invention are disclosed herein. However, the disclosed embodiments are merely exemplary, and it should be understood that the invention may be embodied in many various and alternative forms. The Figures are not to scale and some features may be exaggerated or minimized to show details of particular elements while related elements may have been eliminated to prevent obscuring novel aspects. Therefore, specific structural and functional details disclosed herein are not to be interpreted as limiting but merely as a basis for the claims and as a representative basis for teaching one skilled in the art to variously employ the present invention. For purposes of teaching and not limitation, the illustrated embodiments are directed to photoconductive devices employing MEG and Auger-assisted photoionization.

As used herein, the terms, "comprises" and "comprising" are to be construed as being inclusive and open ended, and not exclusive. Specifically, when used in this specification including claims, the terms, "comprises" and "comprising" and variations thereof mean the specified features, steps or components are included. These terms are not to be interpreted to exclude the presence of other features, steps or components.

As used herein, the terms "about" and "approximately, when used in conjunction with ranges of dimensions of particles, compositions of mixtures or other physical properties or characteristics, is meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present invention.

As used herein, the coordinating conjunction "and/or" is meant to be a selection between a logical disjunction and a logical conjunction of the adjacent words, phrases, or clauses. Specifically, the phrase "X and/or Y" is meant to be interpreted as "one or both of X and Y" wherein X and Y are any word, phrase, or clause.

The present invention provides improved photoconductive devices and methods of detecting optical power or images with photoconductive devices by utilizing MEG and Auger-assisted ionization to trap carriers. The use of this novel mechanism to trap carriers, and therefore enhance photoconductive gain, provides a new class of photoconductive devices.

In photoconductive detectors (25), electron-hole pair generation resulting from the absorption of an incident photon is followed by trapping of one type of carrier (such as electrons) and flow of the other (such as holes). If the flowing carrier can be recirculated—withdrawn from one contact and reinjected from the other—multiple times during the lifetime of the trapped carrier, then photoconductive gain results: many charges are collected per incident photon. In sum, photoconductors benefit from the capture of charge carriers to sensitizing centers, or traps.

A photoconductive device according to the invention, and its method of operation, is illustrated in FIG. 1. FIG. 1(a) shows the band structure 10 of a confined material comprising a semiconductor or other material with an electronic band gap, such as an insulator, where confinement has increased the band gap between the conduction and valence bands relative to the bulk band gap to new confinement-induced conduction 12 and valence 14 bands. Also shown in FIG. 1(a) is a trap state 16, with an energy $E_t$ that is close to the conduction band energy $E_c$ 12.

In FIG. 1(b), the absorption of a photon with sufficient energy to achieve MEG is shown. It has been taught in the prior art that the threshold for efficient MEG is approximately 2.7 times the confinement-induced band gap. MEG leads to the excitation of two excitons, shown in the Figure as two adjacent conduction band electrons 20 and two adjacent holes 22.

Without the effect of confinement, the excitons would likely decay via radiative and/or non-radiative transitions. However, due to confinement, the exciton's spatial overlap is enhanced, typically increasing the cross-section for Auger recombination. Efficient Auger recombination is shown in FIG. 1(c), wherein one exciton recombines and one carrier 32 associated with the other exciton is excited high above the band edge.

As discussed above, photoconductors achieve high internal photoconductive gain due to the trapping and subsequent long decay times of carriers in trap states. In a preferred embodiment of the present invention, the trap states that are shown in FIG. 1 capture carriers with energies high above the conduction band edge more efficiently than carriers near the conduction band edge. This preferred embodiment is shown in FIG. 1(c), where an energy barrier 30 suppresses the trapping of low-energy conduction band electrons.

Due to the presence of the energy barrier, electrons excited high into the conduction band by Auger recombination of multiple excitons are preferentially captured by the trap states 40. This process, which is henceforth referred to as Auger-assisted ionization, is shown in FIG. 1(d), where the excited electron in FIG. 1(c) has been captured by the trap state.

Accordingly, in a preferred embodiment of the invention, a photoconductive device is provided in the form of a confined semiconductor or other material with an electronic band gap with trap states located near the confinement-induced conduction band edge, with an energy barrier such that the capture of carriers by the trap states is more efficient for carriers excited high above the conduction band edge than for carriers near the conduction band edge. The confined geometry causes spatial overlap of photogenerated multiple excitons so Auger recombination is a dominant decay mechanism for multiple excitons, where the Auger recombination cases the excitation of a carrier high above the conduction band edge that is subsequently captured by the trap states. In short, the invention provides a new class of photoconductive devices in which MEG and Auger-assisted ionization cause the efficient capture of carriers in trap states.

Figure 2:
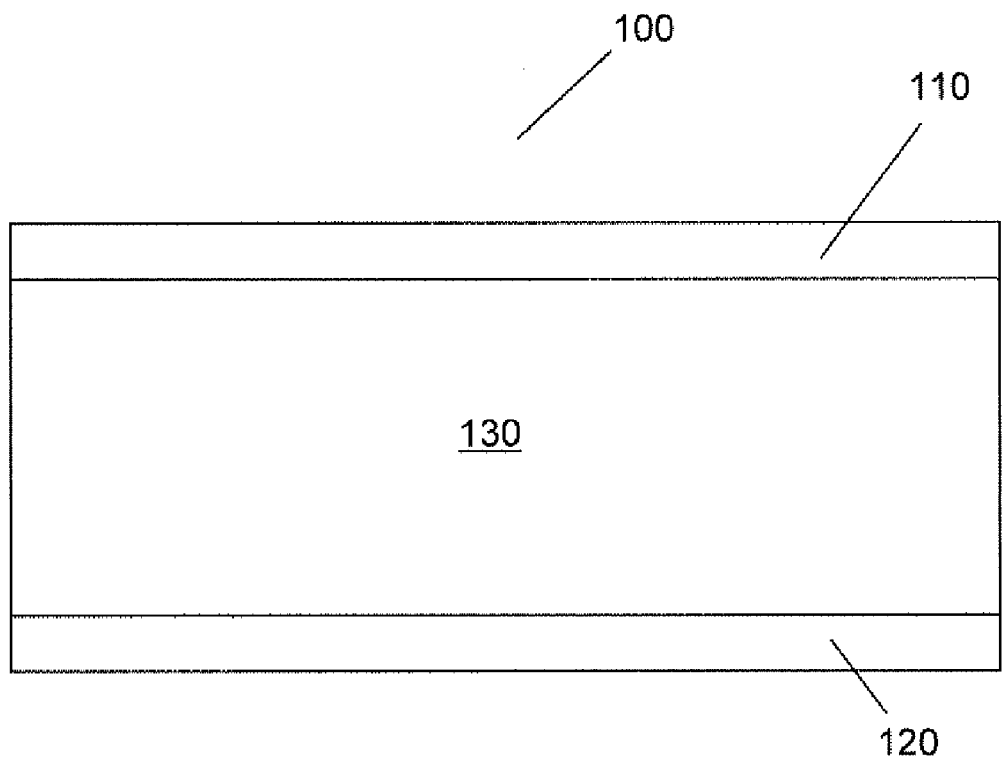
FIG. 2 illustrates a photoconductive device with upper and lower contacts.

Referring to FIG. 2, the photoconductive device 100 preferably includes electrical contacts 110 and 120 for applying a voltage to the photoconductive material 130, which causes the collection and recirculation of holes during the lifetime of the captured electrons, thereby producing an internal photoconductive gain exceeding unity. One of the electrical contacts is at least partially transmissive to allow the transmission of light into the device. A signal related to a photocurrent is obtained by measuring the current or an external voltage, or using other known signal measuring means known in the art such as the collection or integration of charge which is then related to the optical power incident on the device. The measured signal may be related to the incident optical power by one or more calibration steps. Preferably, the calibration is performed as a function of wavelength of incident light, yielding the spectral responsivity of the photoconductive device.

The invention preferably employs confinement to cause strong Coulombic interaction between photoexcited multiple excitons, which results in Auger recombination as a primary decay mechanism. The confinement does not necessarily need to produce strong quantum effects such as a significant shifting and flattening of the energy bands—the primary role of confinement is to cause spatial overlap of photo-excited excitons and increase the probability of decay via Auger recombination.

In a preferred embodiment of the invention, confinement is provided in all spatial directions, in which the photoconductive material 130 is made up of one or more particles comprising a semiconductor or other material with an electronic band gap. Preferably, the particles are nanoscale particles that form quantum dots, quantum boxes, nanoparticles or nanocrystals. More preferably, nanoscale particles have strong quantum confinement effects that significantly suppress the relaxation of carriers via phonons due to a phonon bottleneck.

The particles can be composed of any material capable of exhibiting MEG. Preferred materials include, for UV and/or visible-wavelength imaging: PbS, PbSe, PbSSe, PbTe, InAs, InSb, Ge, and also core-shell heterostructures in which the core consists of one of the aforementioned semiconductors, and the shell is chosen from another member of the same set or a higher-bandgap semiconductor such as Cd{S, Se, Te, O}, Zn{S, Se, Te, O}, or Sn{S, Se, Te, O}, or PbO. The achievement of enhanced UV and visible imaging using cores made of such semiconductors results from the fact that the bulk bandgap of the core semiconductor materials in this list typically lie in the range 0.28 eV-0.75 eV; thus their quantum-confined bandgaps are greater than equal to this range; thus ~3* this quantum-confined bandgap can include sensors that achieve MEG-enhanced response in the NIR (1.2-1.8 eV), the visible (1.8-2.9 eV), and/or the ultraviolet (>2.9 eV).

Other materials are more suited to providing a MEG enhancement primarily in the UV alone, including, but not limited to, CdSe, CdS, CdSe, Si, ZnS, ZnSe, ZnTe, ZnO, PbO. These materials have bandgaps in the NIR or Visible and thus, with the combination of any quantum confinement+the higher-energy threshold for MEG, typically provide an enhancement for photon energies above 2.9 eV.

In one embodiment, the material according to the invention is comprised of solution-processed nanocrystals where a quantum dot layer is formed by spin coating. In an exemplary embodiment, the nanoparticles are composed of PbS having quantum-confined bandgaps in the 750 to 1000 nm range.

In a preferred embodiment, the material is formed of particles that are functionalized to enable efficient conductive transfer of carriers between nanocrystals. In one embodiment, charge transport is enhanced as a result of packing quantum dots more closely with the aid of ligand exchange. In an exemplary embodiment, the final ligand coating the particle is an ethanethiol ligand. In other embodiments, the quantum dots may be coated with bidentate ligands such as ethanedithiol or benzenedithiol. The use of benzenedithiol or other ligands or linkers possessing aromatic moieties may facilitate achievement of higher temperature stability of the resultant devices resulting in part from lower volatility from the organics included in the final device. The use of a linker or ligand possessing an aromatic ring may also facilitate the transport of at least one type of carrier (such as electrons) as a result of delocalization of that carrier along the ring in the LUMO (for electrons) or HOMO (for holes) orbitals.

In general, to achieve photoconductive gain, it is important for the flowing charge carrier to traverse the device (the space between the contacts) in less than the carrier lifetime. For typical electrode spacings of ~1 um and typical biases in the few Volts and typical trap state lifetimes in the tens of milliseconds, this condition can typically be satisfied when the flowing carrier possesses a mobility in excess of 1E-4 cm2/Vs. To achieve high external quantum efficiency, substantially all light of interest in sensing is preferably absorbed. In typical dense colloidal quantum dot films this can be achieved with thicknesses in the range 200-600 nm depending on the wavelengths of interest, the composition of the dots, and the density of packing of the colloidal quantum dot solid. When wavelengths of interest are well in excess of the bandgap (such as in MEG-enhanced photoconductors), the needed thickness may be greatly reduced: 80-100 nm may for example be sufficient to absorb substantially all UV light when a PbS colloidal quantum dot solid is used for sensing.

Trap states according to the invention may comprise defect states localized at an interface, trap states formed by the attachment of ligands to the surface of a particle or other structure, impurities, native sulfates (eg. PbSO3 or PbSO4 on PbS, where PbSO3 provides the preferred embodiment in view of its typical ~20-40 ms trap state lifetime), and native oxides (eg. PbO on PbS). Preferably, the trap states are within 0.05-0.15 eV of the confinement-induced band edge, such as is the case with PbSO3 lying approximately within 0.08-0.12 eV of the quantum-confined conduction bandedge of PbS quantum dots of ~2 nm diameter and ~900 nm bandgap.

The energy barrier formed between the trap states and excited carriers within the material may be formed via a semiconductor shell (such as those recited above—for example, CdS and PbO) and/or may involve the ligand such as ethanethiol, ethanedithiol; and/or may involve impurity traps or native oxide or sulfate or selenate or tellurate traps such as PbSO3 or PbO on PbS. In one embodiment, the barrier is formed due to the presence of a thin layer of oxide on the surface of the material. Preferably, the barrier has a height of at least 0.1 eV to ensure that carrier capture from the lowest-lying confined state occurs with lower efficiency than capture from the higher-lying states.

In the embodiment shown in FIG. 2, the electrodes are placed on top and bottom surfaces of a substantially planar photoconductive layer, where at least one layer is formed with an electrically conductive material that is also optically transmissive over the desired spectral operating range of the device.

Figure 3:
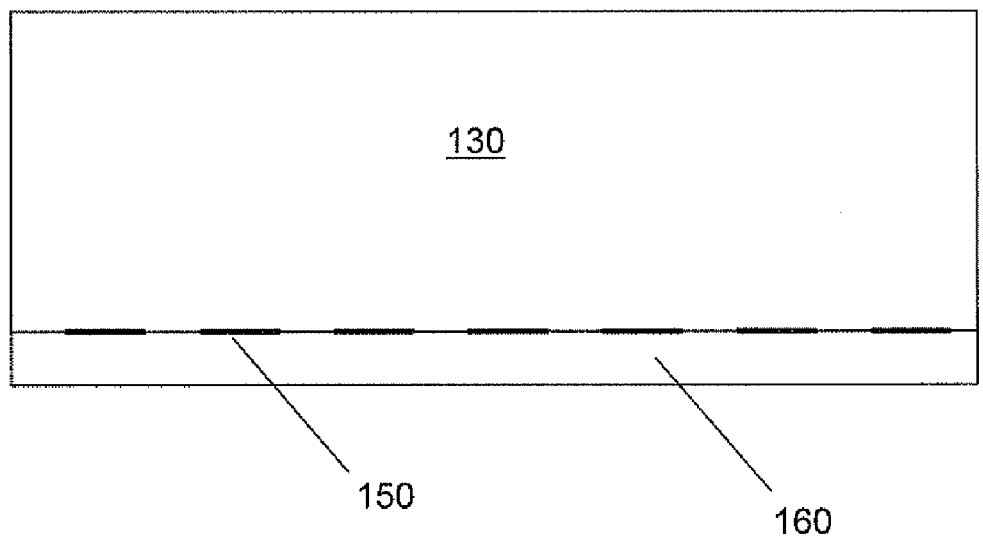
FIG. 3 illustrates a photoconductive device with interdigitated electrodes.

In one embodiment shown in FIG. 3, electrodes 150 are provided in an interdigitated arrangement on an insulating substrate 160, which advantageously provides a photoconductive channel with a length that is much greater than its lateral width. Accordingly, such a structure forms a photoconductive cell.

Figure 4:
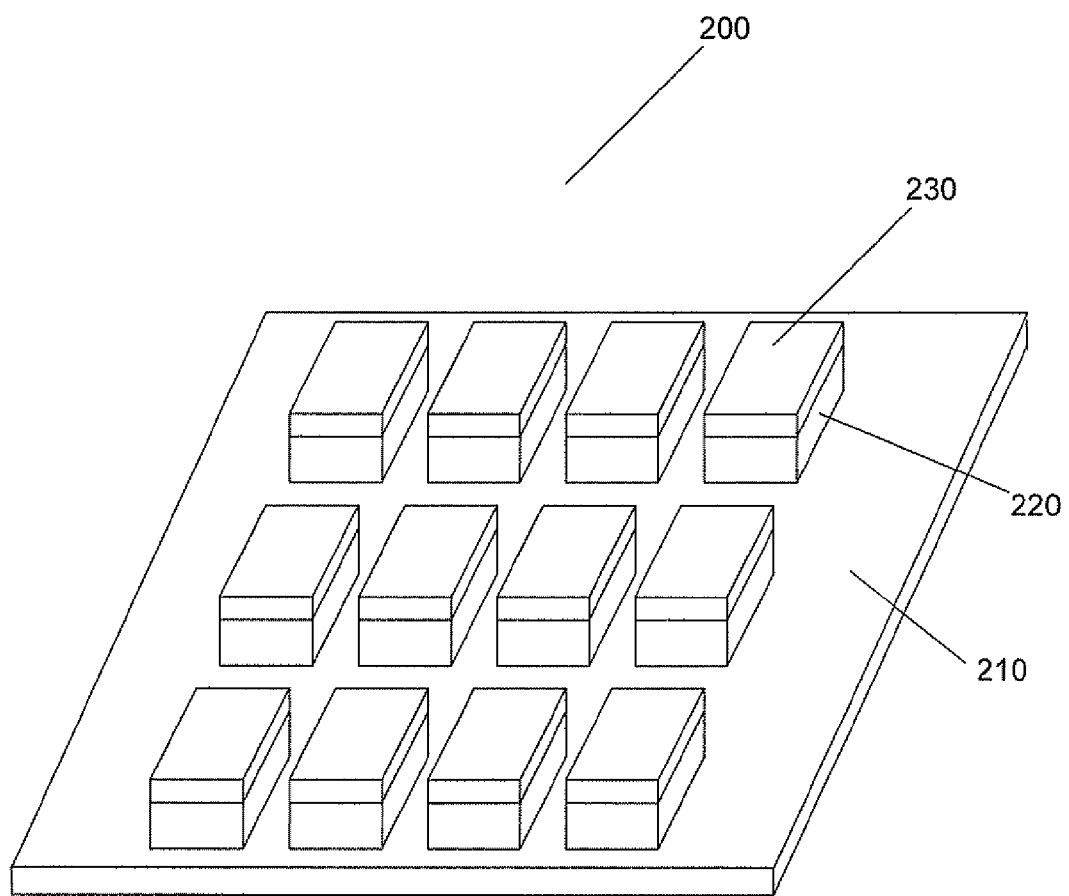
FIG. 4 illustrates a two-dimensional array of photoconductive devices.

In a preferred embodiment, planar photoconductive devices according to the aforementioned embodiment are arranged in a one- or two-dimensional array, forming a photodetector array. Preferably, as illustrated in FIG. 4, a two-dimensional photoconductive array is provided, which may be used as a photoconductive image sensor. While many arrangements are known in the art for contacting elements of an array, FIG. 4 shows a two-dimensional array 200 in which one common electrode is formed on a substrate 210 beneath multiple photoconductive elements 220 in the array, and each element 220 further comprises an additional upper electrode 230. At least one of the electrodes is at least partially transmissive. One electrode for each pixel is then connected to a circuit, such as one which is fabricated atop a CMOS silicon substrate, where the circuit is responsible for biasing the photoconductive device and accumulating the charge collected over a specified integration period (the exposure time).

In another preferred embodiment, a two-dimensional photoconductive image sensor is provided according to the invention wherein the threshold for MEG is in or near the ultraviolet range of the electromagnetic spectrum. Accordingly, such an embodiment provides an ultraviolet image sensor with large internal photoconductive gain the in ultraviolet.

While the above embodiments provided a photoconductive device in which the trap states and energy barrier are located in the conduction band, the invention further contemplates embodiments in which the trap states and energy barriers are located in the valence band, whereby holes are trapped and electrons are mobile within the device.

The aforementioned embodiments of the invention can be used in a wide array of applications, including, but not limited to, applications relating to power measurement, spectral characterization of light, and imaging. Exemplary uses of photoconductive devices according to the invention include ultraviolet photocells, missile-warning systems, detection systems for airborne biological agents, detector arrays for use in spectrometers, industrial flame sensors, military and security sensing and imaging applications, forensic analysis, and ultraviolet machine vision systems, particularly reflected ultraviolet imaging systems.

In general, certain soft materials and photoconductors have previously exhibited a memory effect—long-lived persistence in the response to light. In imaging this can produce ghosting or burn-in of bright images and is generally undesired. A number of solutions are available. First, frame subtraction may be employed to examine the 'delta' between the light image and a recently-acquired dark frame. Second, a time-dependent bias pulse may be applied in order to reset the photoconductor to a predetermined, light-history-independent state prior to beginning the integration of the exposed frame. Further, the device may be designed as designed herein such that only one class of trap state, having a single lifetime, is present, as a result of a substantially single, pure chemical species (such as PbSO3) responsible for forming that trap state is provided. Preferably, the device possesses a chemical composition that is stable over time and does not evolve as a result of with light exposure and/or chemical exposure. This can generally be achieved by encapsulation of the device so that a nonreactive, or passivating, environment is provided to the nanoparticle film.

The following examples are presented to enable those skilled in the art to understand and to practice the present invention. They should not be considered as a limitation on the scope of the invention, but merely as being illustrative and representative thereof.

EXAMPLES

Example 1

Sample Preparation and Experimental Design

Nanoparticle synthesis, exchange, and processing were carried out as follows. Synthesis: PbO (0.9 g, 4.0 mmol), oleic acid (2.67 g, 9.50 mmol), and octadecene (4.73 g, 18.8 mmol) were mixed (solution A). Hexamethyldisilathiane (210 mL) was mixed with octadecene (10 mL) in a nitrogen glove box (solution B). Solution A (19.5 mL) was injected into a flask under argon and the temperature of the solution was raised to 120° C. under heavy stirring. Solution B was then injected into this flask, after which the solution was allowed to cool. When the temperature reached 35° C. the reaction was quenched with acetone (40 mL). The mixture was then washed repeatedly by suspension in toluene and precipitation in acetone.

Figure 5:
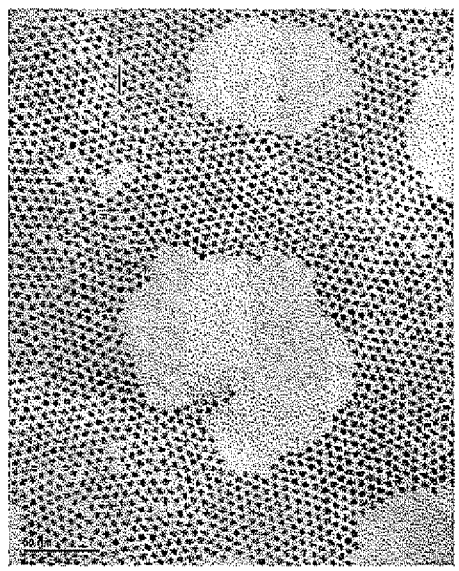
FIG. 5 shows (a) a transmission electron microscopy image of PbS nanocrystals and (b) an optical transmission spectrum of PbS crystals in toluene, revealing an excitonic peak at about 945 nm.
Figure 5:
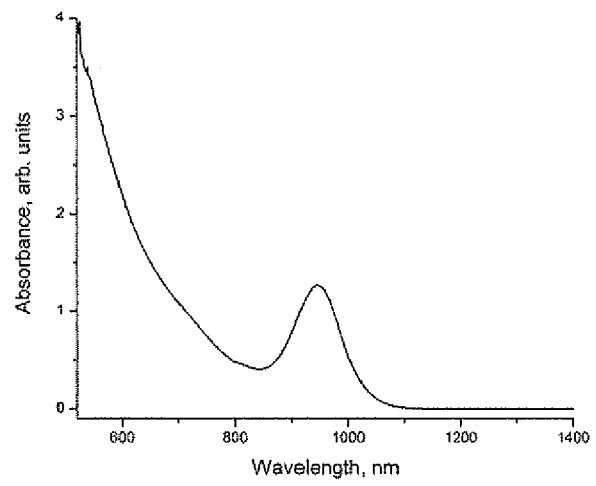

FIG. 5 shows a TEM image of the nanoparticles used herein as well as an absorption spectrum. The materials exhibited a first excitonic absorption features at 945 nm. Three different sizes of nanoparticles were prepared by varying the Solution B injection temperature in the 60° C.-120° C. range.

The long insulating oleate ligands were replaced with short ethanethiol ligands by adding ethanethiol to the toluene-dispersed nanoparticles, incubating the mixture for 45 min, terminating the exchange process by precipitating with hexanes, centrifuging, and redispersing nanocrystals in chloroform. The nanocrystals were then spin-coated onto a glass substrate patterned with interdigitated electrodes running parallel over a 3 mm length and separated by a 5 µm gap. The film thickness (90 nm) was selected to provide a high optical density of 2 at 220 nm. Absorption spectra of the thin film reveal an excitonic feature at 905 nm (1.37 eV bandgap).

The optoelectronic performance of the devices were characterized under an applied field of 2 V/µm for dark current, responsivity, photocurrent decay time, and internal photoconductive gain. In all experiments, photon fluences were chosen that ensured that—in the single-exciton generation case—the steady-state average number of excitons per dot was well below unity. The highest intensity of 200 nW/cm² corresponds to a flux of $10^{12}$ photons cm$^{-2}$ s$^{-1}$, a generation rate at the shortest (most strongly-absorbed) wavelengths of $10^{16}$ electron-hole pairs cm$^{-3}$ s$^{-1}$, and, for the 20 ms lifetimes observed herein, steady-state carrier densities of $10^{14}$ cm$^{-3}$. In contrast, the volume density of quantum dots was well above $10^{19}$ cm$^{-3}$.

Absorption spectra for 90 nm films on a sapphire substrate (FIG. 6b) were acquired using the Varian Cary 500 spectrophotometer. The UV-transparent sapphire substrate with a refractive index of 1.78—similar to the refractive index of PbS CQD thin films—was used to eliminate Fabry-Perot interference features in measured spectra. The first excitonic absorption peak is well defined at 905 nm (1.37 eV bandgap energy). Absorption decays to a baseline at longer wavelengths. Modulation in the absorption spectrum in the 1200-2000 nm range is due to thickness variation of the reference and sample sapphire substrates.

Device responsivity, internal photoconductive gain, and photocurrent transients were measured with the aid of the Agilent 4155 semiconductor parameter analyzer and light-emitting-diode continuous-wave and square-pulse (1 second periodicity) illumination. Devices were biased using an applied field of 2 V/um and uniformly illuminated from the thin-film side (as opposed to through the substrate) using the following LEDs: UVTOP-250 (250+/−5 nm wavelength) and Luxeon K2 LXK2-PM12 (530+/−10 nm wavelength). Illumination intensity was determined by measuring the optical power through a 5 mm aperture using the Ophir PD300UV photodetector placed at the sample position. Power striking the device area was calculated by multiplying illumination intensity by the device working area (3 mm×0.005 mm). The Agilent 33220A function generator was used to supply a constant or modulated bias to the LEDs. Photocurrent was determined by subtracting dark current from the total current flowing under illuminated conditions.

Device spectral responsivity was measured with the aid of the quasi-CW (33 ms pulses with 33% duty cycle) output from the Varian Cary 500 spectrophotometer. The light was additionally mechanically chopped at 2 Hz and photocurrent was recorded using a Stanford Research SR830 Lock-in Amplifier in current measurement mode. Illumination intensity was monitored with Ophir PD300-UV photodetector and was in the range 2 nW/cm²-20 nW/cm², i.e. well within the linear range of the photoconductive photodetectors under study (see section 6 below for details). The spectral photocurrent was scaled to match the monochromatic response measured at 530 nm. As a cross-check, the device was illuminated at 250 nm using continuous-wave LED illumination; the responsivity was found to be in excellent agreement with that obtained using the spectrophotometer's illumination. All measurements were performed at room temperature in a dark shielded enclosure.

Example 2

Analysis of Results

FIG. 1(a) depicts the bands of a typical set of PbS colloidal quantum dots used herein. PbS has a bulk bandgap of 0.4 eV; the effective bandgap rises to 1.4 eV through quantum confinement in the 2 nm diameter dots investigated here. A shallow trap, resulting from PbSO3 formed by surface oxidation of PbS (26), lies just below the first confined electron state. The use of devices (27) with a single trap state lifetime facilitated interpretation of the results presented herein.

Device responsivity was determined by dividing photocurrent by the optical power incident on the device area. Internal photoconductive gain (number of registered electrons per absorbed photon) was calculated as $Rhc/(q\lambda A)$ where R is responsivity, h is Planck's constant, q is the electron charge, $\lambda$ is the wavelength, and A is the absorption. Photocurrent dependence on illumination intensity was measured for light intensities up to 200 nW/cm². Over this intensity range, for all wavelengths discussed herein, the photocurrent was found to depend linearly on illumination intensity. When illuminated simultaneously using 250 nm and 530 nm LEDs, the resultant photocurrent was equal to the sum of photocurrents for 250 nm and 530 nm single wavelength illuminations.

Internal gain was determined from the measurement of external gain and absorbance as follows. In conventional photoconductive photodetector theory (31), each photon absorption event would normally produce one electron-hole pair. If the electron is rapidly captured into a trap state, then the long escape time (milliseconds) from this trap ensures that the corresponding photohole is similarly long-lived, and the increase in conductivity due to the photohole persists for the lifetime of the trapped electron. The responsivity, R, of such a device is written:

$$R = \eta G\left(\frac{q\lambda}{hc}\right) \quad (1)$$

where $\eta$ is the optical absorbance of the device; $hc/\lambda$ is the photon energy and thus ensures that the responsivity has units of A/W; and G is the internal photoconductive gain—it is the ratio of the number of electrons flowing (# e-/s) to the rate of photons absorbed (# photons's). There exist now multiple reports of colloidal quantum dot devices having photoconductive gains ranging from tens to thousands (32) and spanning the visible, near infrared, and short-wavelength infrared (30, 33-35).

Figure 6A:
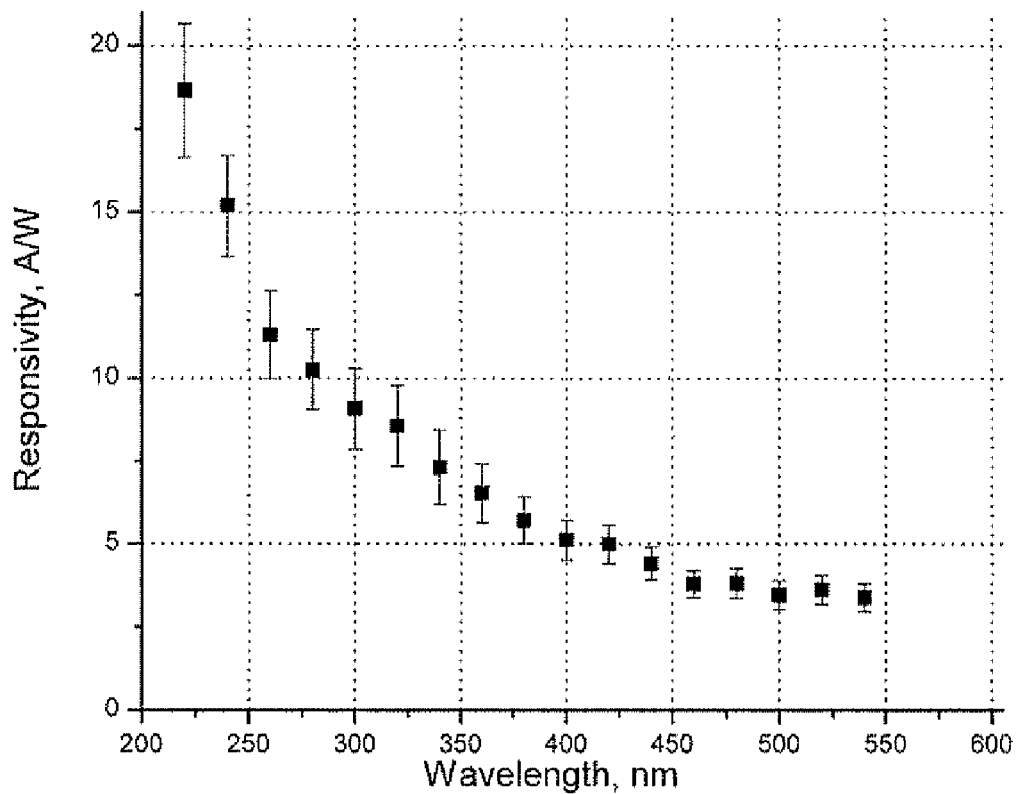
FIG. 6 shows (a) the spectral responsivity of the device for illumination intensities in the 2 to 20 $nW/cm^2$ range; (b) the broadband optical absorbance spectrum of a PbS colloidal quantum dot photoconductive photodetector; and (c) the spectral dependence of the internal photoconductive gain (number of charges collected in the measuring circuit per absorbed photon) of the device. Black squares represent measurements for light intensities in the 2-20 $nW/cm^2$ range using output from a monochromator (5 nm bandwidth) for illumination. Grey bars represent measurements for light intensities in the 10 to 200 $nW/cm^2$ range using light emitting diodes as illumination sources (bandwidths between 12 and 20 nm).
Figure 6B:
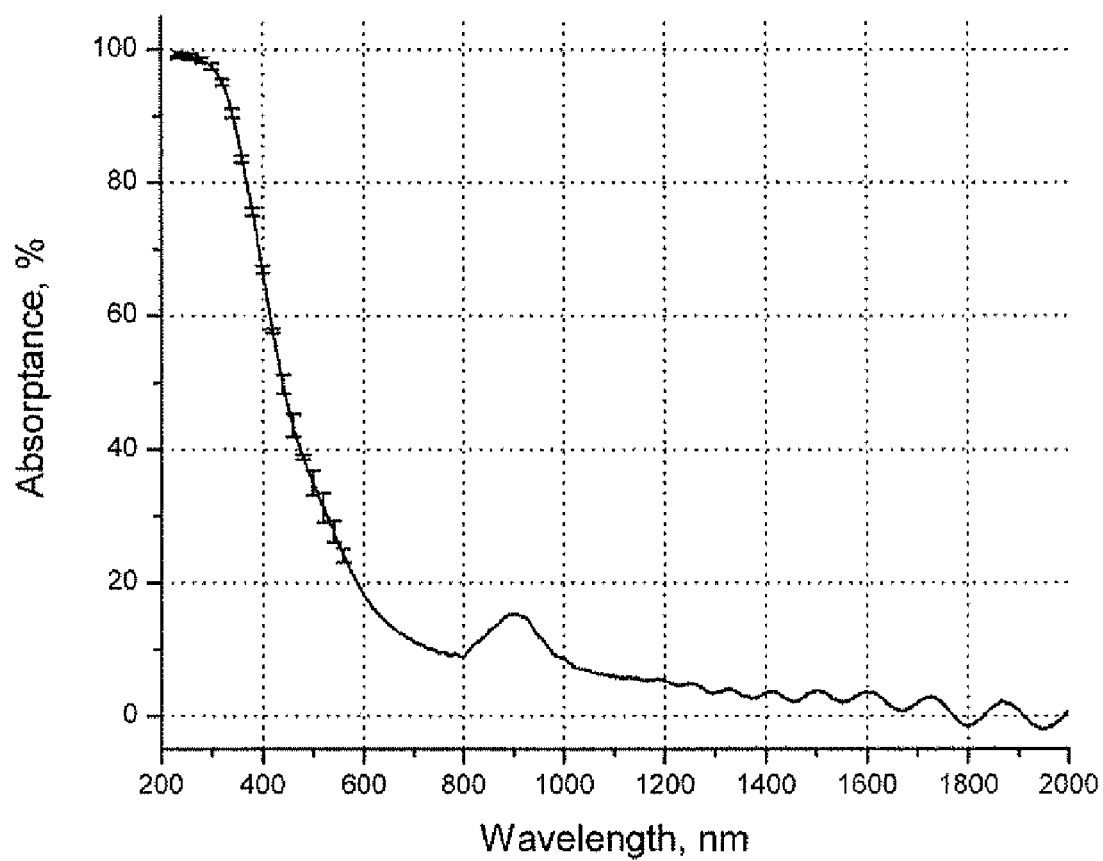
Figure 6C:
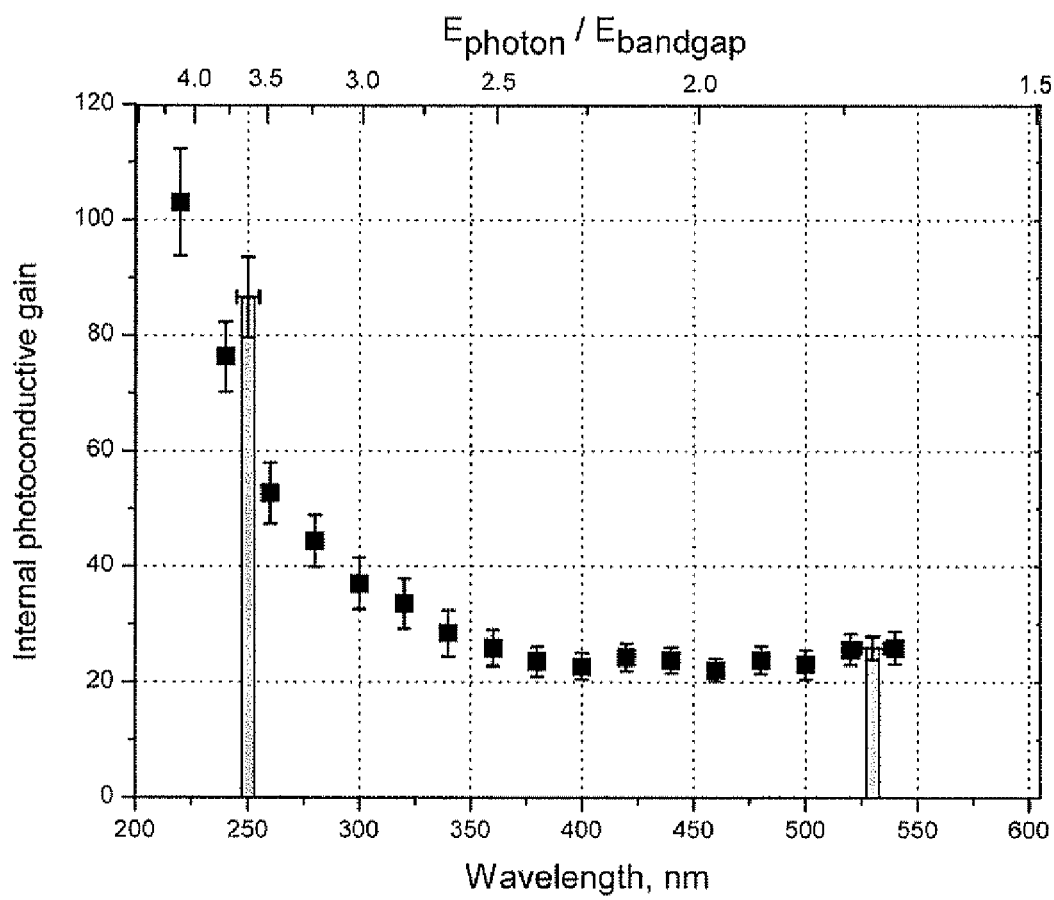

The responsivity spectrum is shown in FIG. 6(a), which reveals responsivity that increases dramatically in the UV spectral range (error bars were calculated as propagated errors $\Delta R = P^{-2}\sqrt{P^2 s_{I_P}^2 + I_P^2 s_P^2}$, where P is optical power striking the device area, $I_P$ is photocurrent, and $s_P$ and $S_{I_p}$ are standard deviations, calculated based on three independent measurement of optical power for each sample area and each photocurrent). By combining this data with careful measurements of the absorbance spectrum of the same film, shown in FIG. 6(b), it was possible to determine the internal photoconductive gain of the device, plotted in FIG. 6(c). In FIG. 6(c), error bars were calculated as propagated errors $\Delta IPG = N_e^{-2} \sqrt{N_e^2 s_{ap}^2 + N_{ap}^2 s_e^2}$, where $N_e$ is the number of registered electrons per second, $N_{ap}$ is the number of absorbed photons per second, and $s_e$ and $s_{ap}$ are standard deviation for $N_e$ and $N_{ap}$, respectively, for the set of 3 independent measurements FIG. 6(c) reveals that the internal photoconductive gain is, as a function of wavelength, constant (spectrally flat) until 340 nm, a wavelength corresponding to a photon energy equal to 2.7 times the bandgap energy. At higher photon energies, the internal gain rises sharply into the ultraviolet spectral range. The internal gain reaches a value of 100+/-10 at 220 nm wavelength (~4.1 times the bandgap energy) compared to its value of 25+/-3 in the spectrally-flat region below 2.7 times the bandgap energy.

Figure 7A:
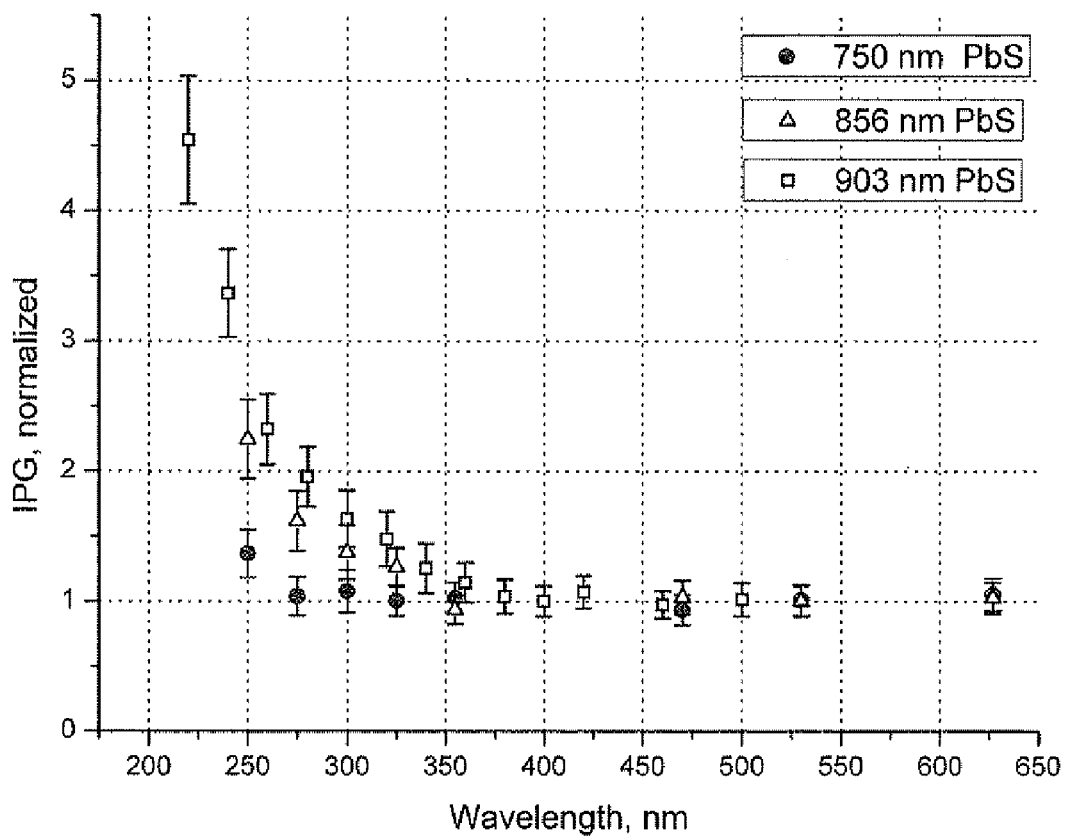
FIG. 7 shows internal photoconductive gain spectra of three devices having different quantum-confined bandgaps. Spectrum (a) is plotted in absolute wavelength, while spectrum (b) is plotted in (unitless) $E_{photon}/E_{bandgap}$.
Figure 7B:
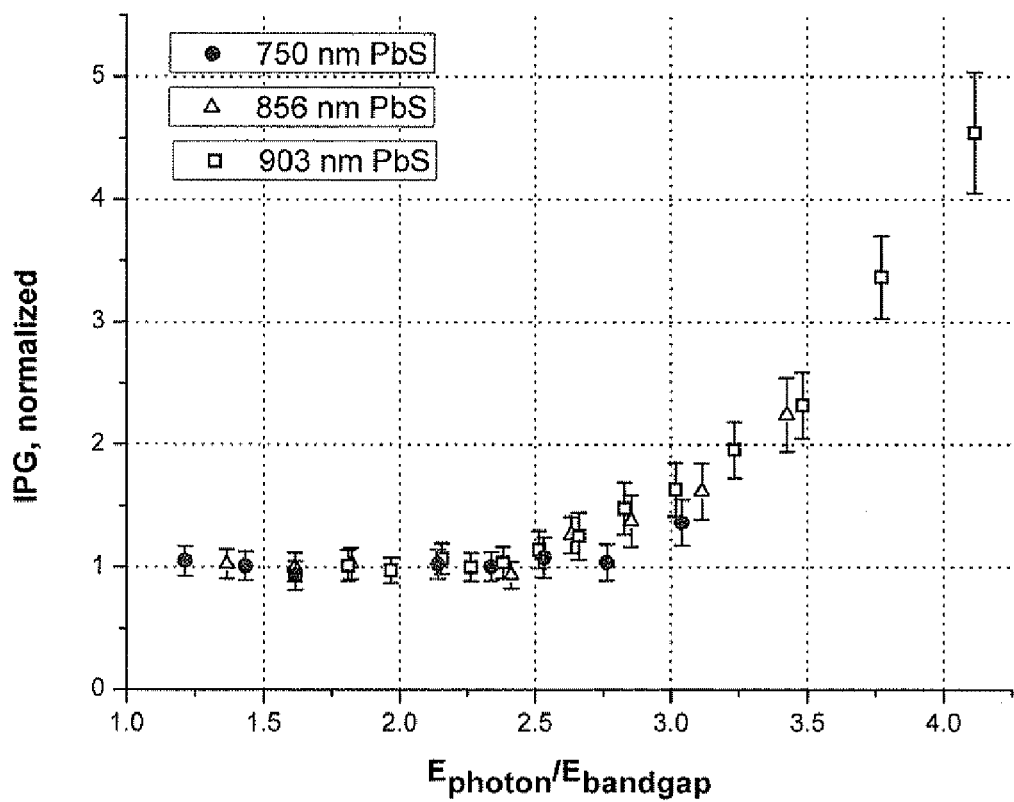

Motivated by the fact that these results were consistent with, even suggestive of, a role for multiple exciton generation, an experiment was sought that could reveal MEG's unambiguous spectral signature: a universal quantum yield curve dependent only on $E_{photon}/E_{bandgap}$. Three devices were fabricated using differently-sized colloidal quantum dots having correspondingly different bandgaps. The devices' internal gain spectra, obtained exactly as in FIG. 6(c), are reported in FIG. 7. The gain spectra clearly illustrate an internal photoconductive gain increase that occurs for photon energies above about 2.7 times the confined band gap.

Example 3

Control Experiments to Investigate Possible Artifacts

Figure 9:
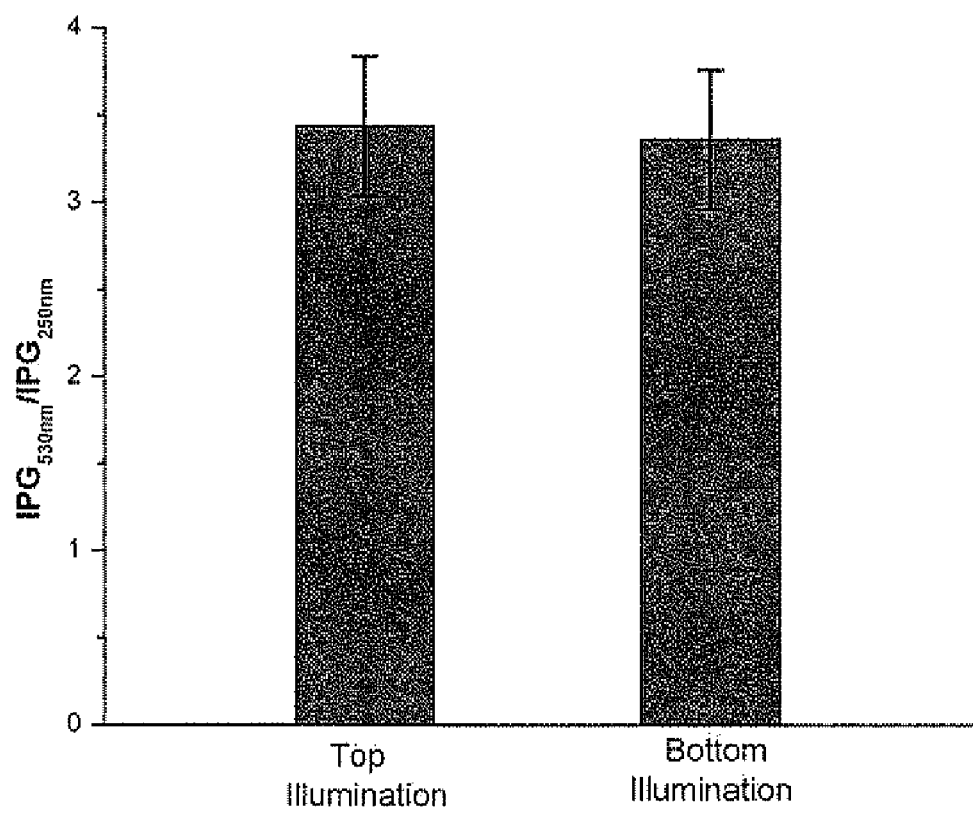
FIG. 9 shows the Ratios of internal photoconductive gain at two wavelengths for the cases of top vs. bottom illumination.

An additional set of experiments were performed to address potential artifactual explanations of these findings. One hypothesis is that trap states could be nonuniformly distributed throughout the film, perhaps clustered closer to the air-film interface; shorter-wavelength light would then be substantially absorbed in these denser/deeper-trap regions. However, comparing internal gain spectra for devices illuminated from the top vs. the bottom, no dependence was found in the curves of FIGS. 6 and 7 on the side of optical incidence (as discussed below in reference to FIG. 9).

A second hypothesis is that, in the case of short-wavelength illumination, excited carriers could be captured directly to traps during the sub-picosecond timeframe prior to relaxation to the quantum-confined band edge without need of MEG and Auger-assisted ionization. This direct-ionization picture is incompatible with the observed universal normalized $E_{photon}/E_{bandgap}$ spectral dependence in FIG. 7; instead it predicts that trapping efficiency should depend on $E_{photon}$, the barrier to electron escape, and the set of trap states available. To vary the trap states, a series of devices were aged in air to alter their trap state densities and depths. It was confirmed that the trap distribution had changed, observing a significant increase in dark current and the emergence of additional, longer-timescale temporal components in the photoresponse consistent with the introduction of new, deeper traps. Despite these significant changes in trap state populations, the spectral gain dependence of FIGS. 6 and 7 was preserved. Taken together, these observations suggest that carrier multiplication occurs more rapidly than either intersubband relaxation or the capture of excited carriers to traps.

Figure 8:
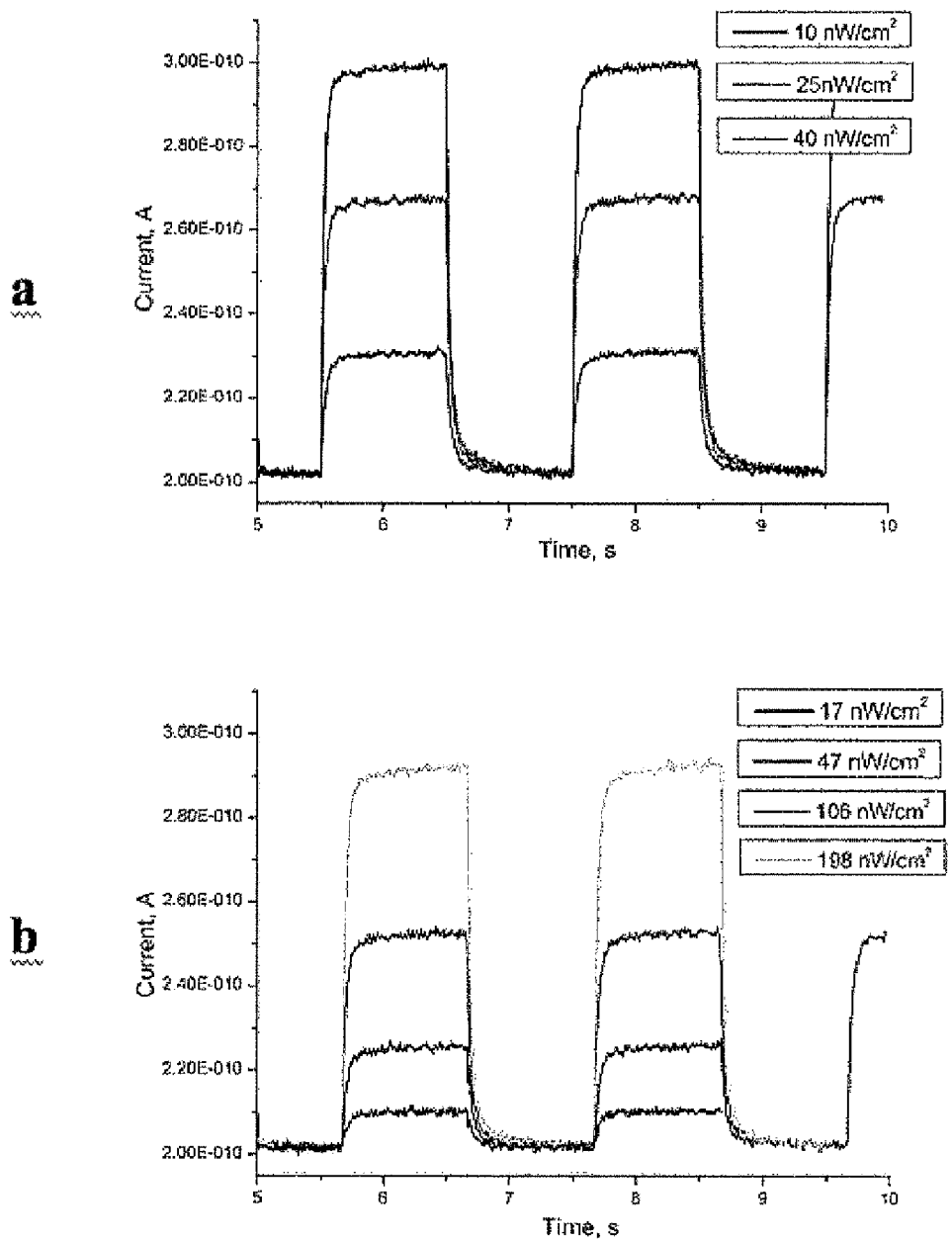
FIG. 8 plots (a) the photocurrent transient response for square pulse illumination for different light intensities at (a) 250 nm and (b) 530 nm.

One explanation of increased photoconductive gain for higher-energy photon excitations would be a prolongation of trap state lifetime for incidence of short-wavelength radiation. This is readily investigated by measuring the temporal response of the photocurrent signal for different wavelengths of illumination. FIG. 8 shows the measured temporal response of the device to a square-wave optical excitation pulse of wavelengths 530 nm (within the region of constant internal gain) and 254 nm (well into the region of enhanced internal gain). The photocurrent decay is characterized by a single time constant of 20 ms for both 254 nm and 530 nm excitation. It was found also that both the time constant, and also the internal gain, did not depend on intensity over a decade of illumination intensities. Combined, these findings indicate that the electron trap state lifetime is independent of the excitation wavelength, and thus that the elevated internal gain at short wavelength is not trivially explained by differential trap state lifetimes.

To investigate a possible artifact of thin film spatial inhomogeneities—a gradient of trap state concentration and/or lifetime across device thickness—internal photoconductive gain was measured at 530 nm and 250 nm illumination for top and bottom illumination. Results, shown in FIG. 9, indicate that IPG exhibits the same spectral dependence for both experimental configurations.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

REFERENCES

1. A. J. Nozik, Chemical Physics Letters 457, 3 (2008).
2. R. J. Ellingson et al., Nano Letters 5, 865 (2005).

3. J. E. Murphy et al., Journal of the American Chemical Society 128, 3241 (2006).
4. R. D. Schaller, M. Sykora, S. Jeong, V. I. Klimov, Journal of Physical Chemistry B 110, 25332 (2006).
5. M. C. Beard et al., Nano Letters 7, 2506 (2007).
6. J. Tauc, Journal of Physics and Chemistry of Solids 8, 219 (1959).
7. S. Kolodinski, J. H. Werner, T. Wittchen, H. J. Queisser, Appl. Phys. Lett. 63, 2405 (1993).
8. N. S. Baryshev, M. P. Shchetinin, S. P. Chashchin, Y. S. Kharionovskii, I. S. Aver'yanov, Sov Phys Semicond 8, 192 (1974).
9. A. Smith, D. Dutton, Journal of the Optical Society of America 48, 1007 (1958).
10. M. C. Beard et al., Nano Letters 9, 836 (2009).
11. A. J. Nozik, Chemical Physics Letters 457, 3 (2008).
12. K. W. Johnston et al., Applied Physics Letters 92, 122111 (2008).
13. K. W. Johnston et al., Applied Physics Letters 92, 151115 (2008).
14. G. I. Koleilat et al., ACS Nano 2, 833 (2008).
15. E. J. D. Klem, D. D. MacNeil, P. W. Cyr, L. Levina, E. H. Sargent, Applied Physics Letters 90, 183113 (2007).
16. M. Law et al., Journal of the American Chemical Society 130, 5974 (2008).
17. J. M. Luther et al., ACS Nano 2, 271 (2008).
18. A. Luque, A. Marti, A. J. Nozik, MRS Bulletin 32, 236 (2007).
19. X. Jiang at al., Journal of Materials Research 22, 2204 (2007).
20. E. H. Sargent, Nature Photon. 3 (2009).
21. M. Law et al., Nano Letters 8, 3904 (2008).
22. J. A. Mcguire, J. Joo, J. M. Pietryga, R. D. Schaller, V. I. Klimov, Accounts of Chemical Research 41, 1810 (2008).
23. V. Klimov at al., Conference on Quantum Electronics and Laser Science (QELS)—Technical Digest Series, 37 (2000).
24. E. Istrate et al., Journal of Physical Chemistry B 112, 2757 (2008).
25. G. Konstantatos at al., Nature 442, 180 (2006).
26. G. Konstantatos, L. Levina, A. Fischer, E. H. Sargent, Nano Letters 8, 1446 (2008).
27. S. Hinds et al., Advanced Materials 20, 4398 (2008).
28. Y. Jin, J. Wang, B. Sun, J. C. Blakesley, N. C. Greenham, Nano Letters 8, 1649 (2008).
29. E. Mutlugun, I. M. Soganci, H. V. Demir, Optics Express 16, 3537 (2008).
30. S. Hinds at al., *Advanced Materials* 20, 4398 (2008).
31. R. L. Petritz, *Physical Review* 104, 1508 (1956).
32. G. Konstantatos et al., *Nature* 442, 180 (2006).
33. G. Konstantatos, E. H. Sargent, *Applied Physics Letters* 91 (2007).
34. G. Konstantatos, J. Clifford, L. Levina, E. H. Sargent, *Nature Photonics* 1, 531 (2007).
35. G. Konstantatos, L. Levina, A. Fischer, E. H. Sargent, *Nano Letters* 8, 1446 (2008).

Therefore what is claimed is:

1. A photoconductive device comprising:
a material provided in a confined geometry, said material comprising an electronic band gap, trap states located near a confinement-induced band edge, and an energy barrier, wherein carrier capture by said trap states is more efficient for carriers excited high above said band edge relative to carriers near said band edge; and
electrical contacts connected to said material;
wherein said confined geometry is selected to achieve spatial overlap of photogenerated multiple excitons; and
wherein said energy barrier is further selected to allow carriers excited by Auger recombination of said multiple excitons to be captured by said trap states.

2. The device according to claim 1 wherein said material comprises a semiconductor.

3. The device according to claim 1 wherein said material comprises particles.

4. The device according to claim 3 wherein said particles are selected from the group consisting of quantum dots, quantum boxes, nanoparticles and nanocrystals.

5. The device according to claim 3 wherein quantum confinement effects produce a separation of energy levels relative to energy levels in bulk material.

6. The device according to claim 1 wherein decay of said excited carriers via phonons is suppressed relative to decay to said trap states.

7. The device according to claim 3 wherein said particles are functionalized to support the electronic transport of photocurrent between said particles.

8. The device according to claim 1 wherein said trap states are selected from the group consisting of defect states localized at an interface, trap states formed by the attachment of ligands to the surface of a particle or other structure, impurities, native sulfates and native oxides.

9. The device according to claim 1 wherein material is selected from the group consisting of CdSe, CdS, CdSe, Si, ZnS, ZnSe, ZnTe, ZnO, PbO, PbS, PbSe, PbSSe, PbTe, InAs, InSb, and Ge.

10. The device according to claim 1 wherein said material comprises a core-shell heterostructure.

11. The device according to claim 10 wherein said shell forms said energy barrier.

12. The device according to claim 10 wherein said core comprises a material selected from the group consisting of CdSe, CdS, CdSe, Si, ZnS, ZnSe, ZnTe, ZnO, PbO, PbS, PbSe, PbSSe, PbTe, InAs, InSb, and Ge, and wherein said shell comprises one of a material selected from said group and a material selected from the group consisting of higher-band-gap semiconductors comprising Cd{S, Se, Te, O}, Zn{S, Se, Te, O}, Sn{S, Se, Te, O}, and PbO.

13. The device according to claim 1 wherein said electrical contacts comprise an interdigitated electrode pair.

14. The device according to claim 1 wherein said material is provided in a substantially planar structure and said electrical contacts comprise planar electrodes each contacting one side of said planar structure, wherein one or both of said planar electrodes are transmissive over a selected spectral range.

15. An apparatus comprising an array of photoconductive devices according to claim 1.

16. The apparatus according to claim 15 where said array forms an imaging array.

17. The apparatus according to claim 16 where said material is selected to have threshold photon energy for multi-exciton generation in the ultraviolet range of the electromagnetic spectrum, and wherein said imaging array with a high internal gain in the ultraviolet range of the electromagnetic spectrum.

* * * * *

UNITED STATES PATENT AND TRADEMARK OFFICE
CERTIFICATE OF CORRECTION

| | | |
|---|---|---|
| PATENT NO. | : 8,310,022 B2 | Page 1 of 1 |
| APPLICATION NO. | : 12/793010 | |
| DATED | : November 13, 2012 | |
| INVENTOR(S) | : Edward H. Sargent et al. | |

It is certified that error appears in the above-identified patent and that said Letters Patent is hereby corrected as shown below:

Column 14, line 29 (claim 9, line 1) "material" should read --said material--.

Column 14, line 60 (claim 17, line 4) "wherein said imaging array with a high" should read --wherein said imaging array has a high--.

Signed and Sealed this
Fifteenth Day of January, 2013

David J. Kappos
*Director of the United States Patent and Trademark Office*